US006444256B1

(12) United States Patent
Musket et al.

(10) Patent No.: US 6,444,256 B1
(45) Date of Patent: Sep. 3, 2002

(54) FORMATION OF NANOMETER-SIZE WIRES USING INFILTRATION INTO LATENT NUCLEAR TRACKS

(75) Inventors: Ronald G. Musket, Danville; Thomas E. Felter, Livermore, both of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/441,113

(22) Filed: Nov. 17, 1999

(51) Int. Cl.[7] ................................................. B05D 5/12
(52) U.S. Cl. ........................ 427/117; 427/120; 427/532; 427/536; 216/56
(58) Field of Search ................................ 427/532–536, 427/117, 120, 307, 314, 322, 58; 216/56

(56) References Cited

U.S. PATENT DOCUMENTS 3,802,972 A * 4/1974 Fleischer et al. ............... 156/7
4,338,164 A * 7/1982 Spohr ............................ 204/4
5,462,467 A   10/1995 Macaulay et al. ............. 445/50
6,033,583 A * 3/2000 Musket et al. ................ 216/56

OTHER PUBLICATIONS

Williams and Giordano, "Fabrication of 80 Å Metal Wires," Rev. Sci. Instrum. 55 (3), pp. 410–412, Mar. 1984.

* cited by examiner

Primary Examiner—Brian K. Talbot
(74) Attorney, Agent, or Firm—Alan H. Thompson; Michael C. Staggs

(57) ABSTRACT

Nanometer-size wires having a cross-sectional dimension of less than 8 nm with controllable lengths and diameters are produced by infiltrating latent nuclear or ion tracks formed in trackable materials with atomic species. The trackable materials and atomic species are essentially insoluble in each other, thus the wires are formed by thermally driven, self-assembly of the atomic species during annealing, or re-crystallization, of the damage in the latent tracks. Unlike conventional ion track lithography, the inventive method does not require etching of the latent tracks.

45 Claims, 2 Drawing Sheets

# FORMATION OF NANOMETER-SIZE WIRES USING INFILTRATION INTO LATENT NUCLEAR TRACKS

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to the fabrication of nanometer-size wires useful as interconnects between levels in microelectronic devices, as non-linear optical devices, and as arrays of sharp field emitters for vacuum microelectronics, including field emission video displays.

2. Description of Related Art

Creation of nanometer-size wires with large length-to-diameter ratios has previously been accomplished using various lithographic techniques to form a cylindrical or square hole in a resist material and using this hole as a mold for forming a wire. Presently, focused electron beams, focused ion beams, and UV photons can be used to create wires with dimensions down to 100–200 nm. Nuclear or ion track lithography, which relies on the etching of the cylindrical latent tracks created in a material, has been used to create nanometer-sized wires, i.e., wires with diameters smaller than 100 nm. Of the wires produced using nuclear track lithography, the smallest diameter reported is approximately 8 nm [Williams and Giordano, *Fabrication of 80 Angstrom Metal Wires*, Rev. Sci. Instrum. 55 (3), 410 (1984)]. Furthermore, the relatively small nanometer-sized wires are produced if the nuclear tracks are annealed prior to etching. Nevertheless, all such methods involve etching the latent tracks to remove a volume of material along the ion trajectory prior to filling the etched track space with the wire material by coating and/or electroplating.

SUMMARY OF THE INVENTION

The present invention involves the production of nanofilaments or nanometer-size (cross-sectional) wires having diameters of less than about 5 nm, and preferably above 0 to 2 nm, that are particularly useful as interconnects between levels in microelectronic devices, as non-linear optical devices, and as field emitters for vacuum microelectronics and video displays.

The present invention includes such small novel wires and a method for producing such wires. Steps in the method include forming a latent nuclear or ion track in a trackable material, infiltrating the latent track with an atomic species that has essentially no mutual solubility with the trackable material, and annealing the tracked material containing the infiltrated latent track at relatively high temperatures to form a wire within the volume of the latent track. Also, prior to infiltration, the eventual diameter of the wire can be controlled by partial, pre-annealing the latent track volume at temperatures between those of infiltration and final annealing. An advantage of the invention allows the preparation of such wires without etching latent tracks in the trackable material. The method relies on the thermally driven self-assembly of atomic species after infiltration into the latent nuclear tracks. The wires comprise the infiltrated atomic species and usually have diameters of above about 0.1 to about 8 nm with high aspect ratios; however, in a highly preferred embodiment, the resultant nanowires have diameters less than 8 nm, and preferably less than 1 nm, such as about 0.3 to about 0.5 nm. Such small wires can provide essentially one-dimensional quantum confinement or less, including monocrystalline nanowires and quantum dots.

DETAILED DESCRIPTION OF THE INVENTION

The method of the invention for making nanometer-size wires using nuclear or ion tracking without the necessity of etching the latent tracks is conveniently described in the following embodiments.

Figure 1A:
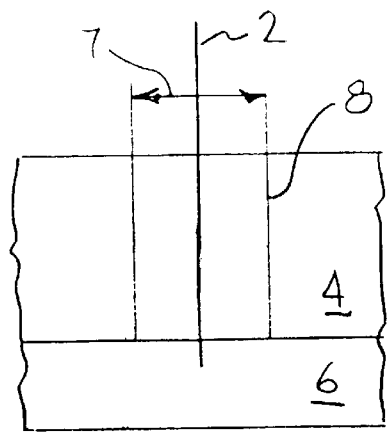
FIG. 1A illustrates the formation of a latent nuclear track in a trackable material.

As shown in FIGS. 1A–1E, formation of nanometer-size wires using the present method includes multiple steps. In FIG. 1A, an initial step is the directed passage of an appropriate ion via path 2 through a trackable material 4 mounted on a conducting or resistive film, i.e., substrate 6, to create a latent nuclear track 8 having an initial diameter 7. Although any source of ions that can surmount the threshold energy for creating the latent track in the trackable material is useful, examples of preferred sources of ions include systems such as Xe ions with energies greater than about 5 MeV in thermal fused silica films. Useful ions include those of atomic number from 1 to 92 having energies above about 0.1 MeV to greater than about 1 GeV, depending on the trackable material. Each latent nuclear track includes an essentially continuous, cylindrical volume of the trackable material that has been modified via energy deposition by the ion into electronic and atomic displacement processes of the trackable material so as to produce a less dense, chemically different portion of the trackable material, i.e., a latent track. Of course, the length of a nanowire can be controlled by controlling the thickness of the trackable material prior to infiltration of the atomic species into the latent track. In a bulk material, the length of the eventual nanowire can be varied by changing the ion energy, and, consequently, the depth of the continuous latent track.

The lower density region of the trackable material comprising the latent track in a tracked material results from the creation of atomic vacancies in the trackable material, and the chemical modification results from the destruction and/or rearrangement of the pre-existing electronic bonding in the trackable material. The vacancies in the tracked material that comprise the latent track can result from electrostatic displacement and/or freezing of a suddenly heated volume along the ion trajectory to create a density deficit (density reduced compared to the initial trackable material) in the tracked material that is in the range from about 0.5 to about 20 volume percent.

In one feature of the invention, after the initial latent track 8 is produced, a partial (or pre-) annealing step can be performed to decrease the density deficit or vacancy concentration of the latent track. Although not shown in FIGS. 1A or 1B, the partial annealing step is conducted at a temperature less than the final annealing temperature, usually intermediate to that of the infiltration temperature and the final annealing temperature. Such annealing of the tracked material allows a controlled amount of density deficit or vacancy reduction, thus controlling the amount of infiltrated atomic species and the final dimensions of produced wire or nanofilament. Significant partial annealing of the latent track prior to infiltration can reduce the void volume of the latent track substantially, and, hence, reduce the final wire diameter, to less than 5 nm, preferably less than 3 nm, and most preferably less than 1 nm.

In an example of the extent of a latent track, a 15 MeV Xe ion from a conventional source passing perpendicularly through 600 nm of trackable polycarbonate material creates a cylindrical latent track with a diameter below 20 nm. Although polycarbonate is a trackable positive resist, the trackable material for the present method does not need to be etched, i.e., the trackable material can be non-etchable because the latent track does not need to be etched after formation. Nevertheless, the trackable and tracked materials usually encompass a dielectric material that allows the formation of electrically isolated, electrically conducting nanometer-size wires or nanofilaments in the latent tracks. Suitable trackable materials for use herein usually include any polymers that undergo chain scission and inorganic dielectric oxides and nitrides. Preferred trackable materials include polycarbonate, polyethylene terephthalate (PET), Kapton™, muscovite mica, fused silica, quartz, and strontium titanate ($SrTiO_3$). In some instances, when the desired resultant wire is dielectric in nature, the trackable materials can contain conductive material, such as metallic or semi-conducting material. Examples of trackable metallic and semiconducting materials include titanium, zirconium, cobalt, $MoO_3$ and $MoS_2$ crystals.

Figure 1B:
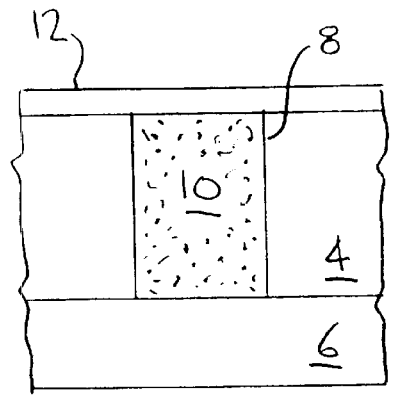
FIG. 1B illustrates the infiltration of atomic species in the non-etched, latent nuclear track.

To form the conducting nanometer-size wires, atomic species (preferably, conducting elemental species) are infiltrated into the latent tracks, thus entering into the pores or vacancies comprising the latent tracks. Either a single elemental species or a mixture of elemental atomic or ionic species can be infiltrated into the latent tracks, depending on the desire to make elemental, alloy, or compound metallic nanowires. Even dielectric nanorods can be produced in any trackable material. In FIG. 1B, infiltration of the elemental conducting atomic species 10 into the latent track cylinder 8 can be accomplished by providing a flux of the conducting atomic species from a solid or liquid coating 12 at the surface of the tracked material that is at a temperature, $T_d$, sufficiently high enough to result in diffusion of the elemental conducting atomic species 10 throughout the latent track volume 8. In general, the temperature $T_d$ of the infiltrating atoms from the flux must be sufficiently low enough that the amount of annealing of the latent track is not substantial (i.e., insignificant relative to the desired cross-sectional dimension or void volume(vacancies) of the latent track), but preferably high enough that the infiltration can be completed in a reasonable time. The coating 12 can also be a sub-atomic monolayer thickness resulting from a dynamic equilibrium between deposition from gas or vapor sources and the infiltration process. Although coating 12 is shown on top of trackable material 4, such diffusable coatings can also be applied to the bottom of such material.

To ensure separation of the wire and the tracked material phases, the trackable material and the infiltrated conducting atomic species must have essentially no mutual solubility for each other at the infiltrating or annealing temperatures, and must not form any intermediate phases or reaction products with one another. Essentially no mutual solubility for each other means less than or equal to 10 atomic percent. The infiltrating conducting atomic species, usually as a flux, can be provided by suitable deposition processes (e.g., vapor deposition by sputtering or evaporation of a target containing the desired element(s), electromigration from coatings, ionic liquids, or liquid metals, and electroplating). Concentration-gradient and/or electric-field-enhanced diffusion (e.g., electro-deposition) can be used to create and to promote the infiltration. Alternatively, the coating of the conducting atomic species can be applied to a surface of the trackable material prior to or concurrently with the track formation.

Thus, infiltration of the latent track can be accomplished by a variety of processes, including electric field enhanced diffusion of ions or atomic species and thermally driven diffusion of atomic species. A solid or liquid coating over and/or under the latent track can be an infinite source of diffusing species. A gaseous source of infiltrating species directed to the latent track can provide a dynamic sub-monolayer surface layer.

Figure 1C:
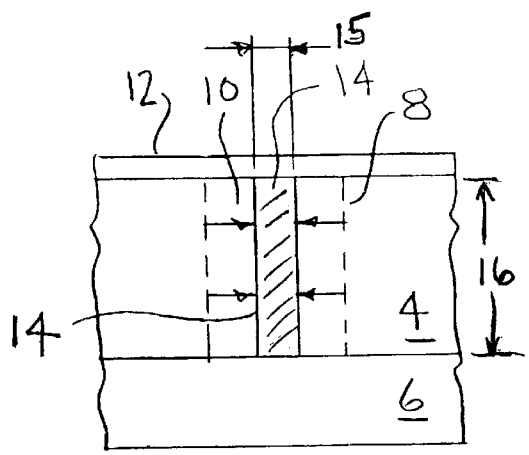
FIG. 1C illustrates the annealing of the tracked material containing the infiltrated atomic species.
Figure 1D:
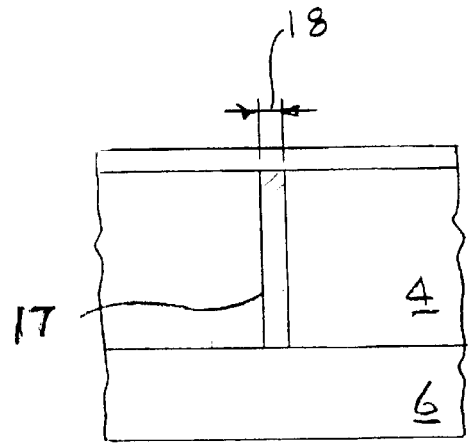
FIG. 1D illustrates the formed nanometer-size wire surrounded by the annealed tracked material.
Figure 1E:
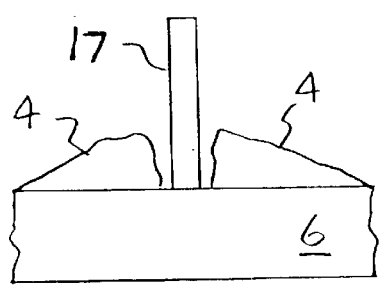
FIG. 1E illustrates an exposed nanometer-sized wire.

FIG. 1C illustrates that once the infiltration of conducting atomic species 10 from coating 12 is completed, thermally driven self-assembly of a conducting wire 14 occurs when the temperature of the infiltrated, tracked material 4 is heated to a temperature, $T_a$, sufficient to anneal, or recrystallize, the latent track 8 and to drive the conducting atomic species 10 out of solution with the tracked material 4 along a cylindrical front indicated by arrows moving inward toward the center of track 8 to form an intermediate wire 14 of reduced diameter 15 (i.e., diameter reduced compared to diameter 7) having an aspect ratio (i.e., length relative to diameter) that is determined by the thickness 16 of the tracked material 4 and can be varied from about 1 to about 20, although ratios above 100 are possible. FIG. 1D illustrates final wire 17 after completion of the annealing of tracked material 4 from the essentially cylindrical-shaped latent track 8 having track size 7 (of FIG. 1A) to its final cross-sectional dimension 18. Contacts to the nanowire are via substrate 6 and coating 12, which can be patterned. For the conditions used, the completion of both the infiltration and the self-assembly processes (e.g., annealing or recrystallizing of the tracked material) can be assessed in real time by, for example, attainment of a steady state value of either (a) the resistance between the top of the tracked material, which is coated with the elemental conducting atomic species, and an underlying conducting layer, or (b) the optical properties (i.e., absorption or emission spectra) of the material, or (c) Rutherford backscattering spectroscopy. FIG. 1E shows that after removal of the residual coating (not shown) of the conducting atomic species, some or all of the tracked material 4 may be removed to leave partially or fully free-standing nano-size wire 17.

Arrays of nanometer-size wires can be made by irradiation of the trackable material using controlled fluences of ions (ions/$cm^2$). Typical densities are about $10^6$–$10^{10}$/$cm^2$, with about $10^8$/$cm^2$ corresponding, on average, to about one wire per $\mu m^2$. The diameter of the latent track is dependant upon the energy density that the ion deposits into electronic excitation, which varies with the ion and energy used to produce the track. Nanometer-size semi-conducting wires with diameters below 20 nm and metallic wires with diameters below about 1 nm can show evidence of one-dimensional quantum confinement and unique electrical properties. In general, the nanometer-size wires produced by this method are polycrystalline, but dimensional constraints of such small diameters can result in monocrystalline wires, particularly if the tracked material is monocrystalline.

Exemplary embodiments of the invention include tracking through a trackable material of 600-nm thick, thermal $SiO_2$ on silicon, and infiltration with atomic metal or semi-conducting species such as Au, Ag, Cu, Pt, Pd, and Si or Ge, respectively. The maximum cross-sectional diameter of the nanometer-size wire formed by the infiltration process can be predetermined by the extent that the latent track has a density that is less than, at least 0.5 percent less than, and usually at least about five percent less than that of the initial trackable material. Preferably such density differentials contribute to the production of a wire having a cross-sectional diameter of less than 8 nm. The extent (i.e., diameter) and density deficit of the latent track is a function of the energy deposited by the ion into electronic excitation and the velocity of the ion. In a calculated example, infiltration of Au into tracked $SiO_2$ (with a pre-tracked density of 2.2 $g/cm^3$ and with an estimated density in the latent track of 2.0 $g/cm^3$), results in a thermally assembled Au wire having a diameter of less than 4 nm, i.e., about 3.35 nm, wherein the Au atoms have filled essentially all the vacancy space in the latent track (in the $SiO_2$) and that essentially all the infiltrated Au atoms have contributed to the formation of the wire.

Formation of nanometer-size wires that are electrically isolated from each other can be accomplished by using a trackable material that is an electrically isolating material, such as $SiO_2$, polymers, strontium titanate, and the like. Such wires can also be prepared by using a tracked material having a thickness greater than the tracking depth of the ion. Examples of such a thick system include the tracking of bulk quartz crystals and infiltration with metal atomic species such as Au, Ag, Pt, Pd, Cu, or semi-conducting species such as Ge or Si.

Figures 2A, 2B:
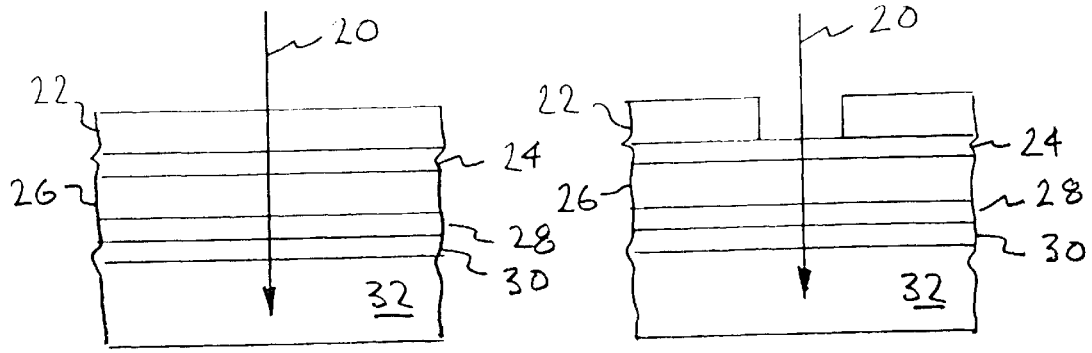
FIG. 2A illustrates penetration of an ion through layers of a microgate device.
FIG. 2B illustrates an etched trackable resist of the microgate device.
Figures 2C, 2D:
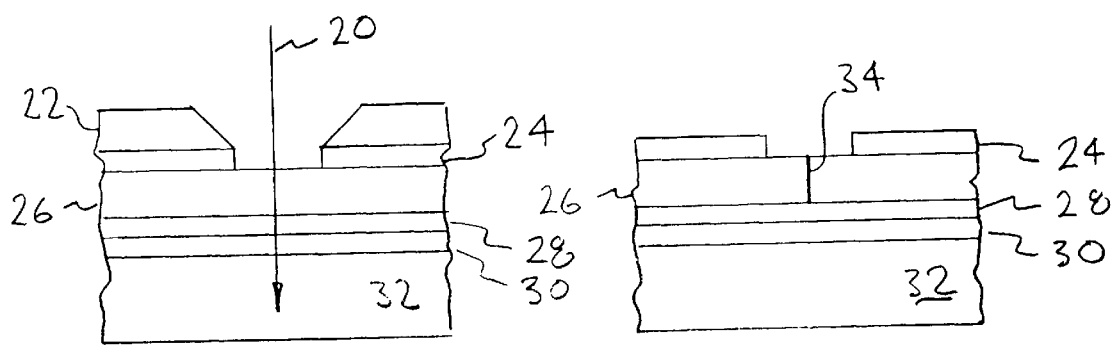
FIG. 2C illustrates an etched metal film below the etched trackable resist of the microgate device.
FIG. 2D illustrates the formation of a nanometer-size wire in the microgate device by the method of the invention.
Figure 2E:
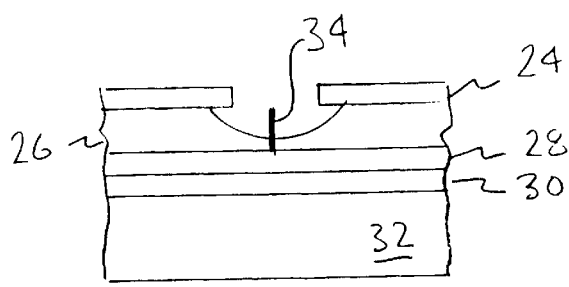
FIG. 2E illustrates a partially exposed nanometer-size, field emitter wire in the microgate device.

In a preferred embodiment, the fabrication of field emission cathodes for flat panel video displays in accordance with the invention is shown in FIGS. 2A–2E. Except for the formation of the nanometer-size wires by the method of the invention, the method illustrated in FIGS. 2A–2E is similar to that shown in U.S. Pat. No. 5,462,467, issued to Macaulay et al., the disclosure of which is incorporated by reference in its entirety herein. FIG. 2A illustrates the initial penetration of an ion through a multilayered structure during the production of a microgate with nanometer-size wire emitters. The path 20 of an ion penetrates in order through adjacent layers of a trackable resist 22, a metal 24, a trackable insulator 26, a resistive layer 28, and a second metal 30 and stops in a substrate 32. FIGS. 2B and 2C respectively illustrate etching of trackable resist 22 and metal 24 about path 20. However, the incorporated reference and other conventional methods would then require that the (trackable) materials along the latent nuclear track be etched out down to resistive layer 28 or to the second metal (conductive) layer 30 (i.e., through the interlayer dielectric 26) to form a mold for deposition of the wires (i.e. nanofilaments). In the present method, as illustrated in FIG. 2D the latent nuclear track need only be etched down through metal 24—the conductive gate electrode (i.e., to the interlayer dielectric). The nanometer size wire is then formed in the latent nuclear track using the present method producing the structure shown in FIG. 2D including nanometer-size wire 34. FIG. 2E shows the exposed wire 34 after partial etching of trackable insulator 26. The present method is a significant modification of prior art methods for the formation of nanofilaments or nanocones, because (a) the nanometer size wires are considerably smaller in diameter than the nanofilaments formed in etched holes or vias and (b) less complicated and less costly steps are required to produce the emitters. The smaller diameter field emitters produced in the present invention increase the electric field strength for a given voltage between the gate and the field emitter, usually by a factor of at least 2, preferably more than 4, and most preferably more than about 10, compared to those prepared from etched latent tracks. Less complicated steps than comparative prior art methods reduce the complexity of the overall cathode process and, thus, increase the robustness and decrease the cost of the system.

Although the wires prepared in the present invention can be utilized in essentially any microelectronic device, the wires are highly preferred for use as interconnects between different levels in microelectronic devices, as non-linear optical devices, and as arrays of extremely sharp field emitters for vacuum microelectronics, including field emission displays.

Changes and modifications in the specifically described embodiments can be carried out without departing from the scope of the invention, which is intended to be limited by the scope of the appended claims.

We claim:

1. A method for preparing a nanometer-size wire having a high length-to diameter aspect ratio, said method comprising:
    forming a latent track in a trackable material; and
    infiltrating said latent track with atomic species having essentially no mutual solubility with said trackable material without prior etching of said track to form a nanometer-size wire comprising said atomic species within said latent track.

2. The method of claim 1 further comprising controlling the temperature of said trackable material to anneal said trackable material containing said atomic species within said latent track.

3. The method of claim 1 wherein said trackable material comprises a dielectric material.

4. The method of claim 3 wherein said dielectric material is selected from the group consisting of fused silica, quartz, mica, polymers capable of undergoing chain scission, strontium titanate, silicon nitride, and diamond-like carbon.

5. The method of claim 1 wherein said wire has a diameter less than 8 nanometers.

6. The method of claim 3 further comprising forming at least a lower metal layer intermediate a substrate and a layer of said dielectric material, and forming at least an upper metal layer over said layer of dielectric material.

7. The method of claim 6 further comprising forming a resistive layer between said dielectric material and said lower metal layer.

8. The method of claim 1 comprising infiltrating said latent track by an electric field enhanced diffusion process.

9. The method of claim 1 comprising infiltrating said latent track by a vapor deposition method including sputtering or evaporation of said atomic species.

10. The method of claim 2 wherein said annealing is conducted at a temperature greater than that of said infiltrating.

11. The method of claim 10 wherein said annealing is conducted at a temperature in the range from about 100 degrees C. to about 1500 degrees C. and said infiltrating is conducted at a temperature in the range from about 0 degrees C. to about 750 degrees C.

12. The method of claim 1 wherein said latent track has a density less than that of said trackable material.

13. The method of claim 1 further comprising coating said trackable material with a liquid or solid conducting layer comprising said atomic species after said forming of said latent track.

14. The method of claim 1 further comprising controlling the temperature of said trackable material to partially anneal said trackable material prior to or simultaneously with said infiltrating of said atomic species within said latent track.

15. A method for preparing a nanometer-size wire having a controlled length-to diameter aspect ratio, said method comprising:

forming a latent track in a trackable material to produce a tracked material;

partially annealing said tracked material; and infiltrating said latent track with an atomic species having essentially no mutual solubility with said tracked material without prior etching of said track to form a nanometer-size wire comprising said atomic species within said latent track.

16. The method of claim 15 wherein said wire having a length of about the thickness of said trackable material.

17. The method of claim 15 wherein said wire is formed by annealing said tracked material after said infiltrating said atomic species into said latent track.

18. The method of claim 17 wherein said partial annealing of said tracked material conducted at a temperature less than said annealing conducted after said infiltrating.

19. The method of claim 15 wherein said mutual solubility is less than 10 atomic percent.

20. The method of claim 15 wherein a conducting or semiconducting coating is applied adjacent said trackable material.

21. The method of claim 20 wherein said coating is applied prior to formation of said latent track.

22. The method of claim 20 wherein said coating is applied after formation of said latent track.

23. The method of claim 15 wherein said atomic species comprise gaseous atomic species.

24. The method of claim 1 wherein sources of said atomic species infiltrating said latent track are selected from the group including solid state coatings, liquid metals or ionic liquids, and dynamic sub-monolayer surface layers on said trackable material.

25. The method of claim 24 wherein said infiltrating accomplished by thermal diffusion of said atomic species and/or ions driven by concentration gradients.

26. The method of claim 24 wherein said infiltrating accomplished by electric field enhanced diffusion of ions of said atomic species.

27. The method of claim 24 wherein said atomic species comprise electrical or heat conducting species.

28. The method of claim 26 wherein said electric field enhanced diffusion comprises electrodeposion, electroplating or electromigration.

29. The method of claim 15 wherein sources of said atomic species infiltrating said latent track are selected from the group including solid state coatings, liquid metals or ionic liquids, and dynamic sub-monolayer surface layers on said trackable material.

30. The method of claim 29 wherein said infiltrating accomplished by thermal diffusion of said atomic species and/or ions driven by concentration gradients.

31. The method of claim 29 wherein said infiltrating accomplished by electric field enhanced diffusion of ions of said atomic species.

32. The method of claim 29 wherein said atomic species comprise electrical or heat conducting species.

33. The method of claim 31 wherein said electric field enhanced diffusion comprises electrodeposion, electroplating or electromigration.

34. A method for preparing a nanofilament comprising a conducting material having a diameter less than 8 nanometers, said method comprising producing a latent nuclear track in a trackable material;

infiltrating said latent nuclear track with said conducting material without prior etching of said latent nuclear track to form said nanofilament.

35. The method of claim 34 wherein said diameter is less than about 5 nanometers.

36. The method of claim 34 wherein said conducting material is selected from the group consisting of elemental metals and alloys of elemental metals.

37. The method of claim 36 wherein said elemental metals are selected from the group consisting of Au, Ag, Pt, Pd, and Cu.

38. The method of claim 34 wherein said nanofilament further comprising an adjacent dielectric material.

39. A method for preparing a nanofilament comprising a material having a diameter less than 8 nanometers, said method consisting essentially of:

producing a latent track in a trackable material;

partially annealing said tracked material; and infiltrating said latent track with said conducting material to form said nanofilament.

40. The method of claim 39 wherein said material is conductive.

41. The method of claim 40 wherein said conductive material is selected from the group consisting of elemental metals and alloys of elemental metals.

42. The method of claim 40 wherein said elemental metals are selected from the group consisting of Au, Ag, Pt, Pd, and Cu.

43. The method of claim 39 wherein said material is semi-conductive.

44. The method of claim 43 wherein said semi-conductive material is Si or Ge.

45. The method of claim 39 wherein said nanofilament further comprises an adjacent dielectric material.

* * * * *